(12) United States Patent
Yang et al.

(10) Patent No.: US 12,550,581 B1
(45) Date of Patent: Feb. 10, 2026

(54) ORGANIC LAYER REMOVAL IN DISPLAYS HAVING TRANSPARENT OPENINGS

(71) Applicant: Apple Inc., Cupertino, CA (US)

(72) Inventors: Shyuan Yang, San Jose, CA (US); Abbas Jamshidi Roudbari, Saratoga, CA (US); Guanxiong Liu, Campbell, CA (US); Jae Won Choi, San Jose, CA (US); Kyounghwan Kim, San Jose, CA (US); Prashant Mandlik, Sunnyvale, CA (US); Ricardo A Peterson, Fremont, CA (US); Sungki Lee, Sunnyvale, CA (US); Ting-Kuo Chang, San Jose, CA (US); Tsung-Ting Tsai, San Jose, CA (US); Wan-Ching Hsu, San Jose, CA (US); Warren S Rieutort-Louis, Cupertino, CA (US); Weixin Li, Sunnyvale, CA (US); Yuchi Che, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 363 days.

(21) Appl. No.: 18/343,578

(22) Filed: Jun. 28, 2023

Related U.S. Application Data

(60) Provisional application No. 63/394,558, filed on Aug. 2, 2022.

(51) Int. Cl.
*H10K 59/65* (2023.01)
*H10K 59/122* (2023.01)
*H10K 59/131* (2023.01)

(52) U.S. Cl.
CPC .......... *H10K 59/65* (2023.02); *H10K 59/122* (2023.02); *H10K 59/131* (2023.02)

(58) Field of Classification Search
CPC ..... H10K 59/65; H10K 59/131; H10K 59/122
(Continued)

(56) References Cited

U.S. PATENT DOCUMENTS

| 7,355,606 B2 | 4/2008 | Paquette |
| 7,473,924 B2 | 1/2009 | Millard et al. |

(Continued)

FOREIGN PATENT DOCUMENTS

| AU | 2013203534 B2 | 5/2013 |
| WO | 2018216545 A1 | 11/2018 |

(Continued)

*Primary Examiner* — James R Greece
*Assistant Examiner* — Hana S Featherly
(74) *Attorney, Agent, or Firm* — Treyz Law Group, P.C.; Joseph F. Guihan; Jinie M. Guihan

(57) ABSTRACT

An electronic device may include a display and a sensor formed underneath the display. The display may have both a full pixel density region and a pixel removal region with a plurality of high-transmittance areas that overlap the sensor. The display pixels may include a cathode. In the high-transmittance areas, the cathode may be selectively removed to form openings that increase transmittance through the display to the underlying sensor. One or more organic layers such as a pixel definition layer and planarization layers may be formed underneath the cathode. In regions under the cathode openings, increased ultraviolet light exposure may cause increased outgassing in the organic layers present. The increased outgassing levels may reduce the brightness of the pixels (particularly at the edges of the pixels). To mitigate display artifacts caused by outgassing, one or more organic layers under each cathode opening may be at least partially removed.

20 Claims, 13 Drawing Sheets

(58) Field of Classification Search
USPC .......................................................... 313/500
See application file for complete search history.

(56) References Cited

U.S. PATENT DOCUMENTS

| | | |
|---|---|---|
| 7,781,979 B2 | 8/2010 | Lys |
| 7,940,457 B2 | 5/2011 | Jain et al. |
| 8,531,118 B2 | 9/2013 | Miskin et al. |
| 8,724,942 B2 | 5/2014 | Logunov et al. |
| 9,098,136 B2 | 8/2015 | Kim |
| 9,286,832 B2 | 3/2016 | Park et al. |
| 10,268,884 B2 | 4/2019 | Jones et al. |
| 11,075,353 B2 | 7/2021 | Hou |
| 2008/0111492 A1* | 5/2008 | Kwak .................. H10K 59/871 445/25 |
| 2014/0375704 A1 | 12/2014 | Bi et al. |
| 2015/0241705 A1 | 8/2015 | Abovitz et al. |
| 2017/0116934 A1 | 4/2017 | Tien et al. |
| 2018/0175125 A1* | 6/2018 | Chung .................. H10K 59/87 |
| 2019/0041658 A1 | 2/2019 | Gollier et al. |
| 2019/0094541 A1 | 3/2019 | Choi et al. |
| 2019/0332841 A1* | 10/2019 | Zhou .................. G06V 40/1306 |
| 2020/0203450 A1 | 6/2020 | Lou et al. |

FOREIGN PATENT DOCUMENTS

| | | |
|---|---|---|
| WO | 2020219267 A1 | 10/2020 |
| WO | 2021188217 A1 | 9/2021 |

* cited by examiner

ORGANIC LAYER REMOVAL IN DISPLAYS HAVING TRANSPARENT OPENINGS

This application claims priority to U.S. provisional patent application No. 63/394,558, filed Aug. 2, 2022, which is hereby incorporated by reference herein in its entirety.

BACKGROUND

This relates generally to electronic devices, and, more particularly, to electronic devices with displays.

Electronic devices often include displays. For example, an electronic device may have a light-emitting diode (LED) display based on light-emitting diode pixels. In this type of display, each pixel includes a light-emitting diode and circuitry for controlling application of a signal to the light-emitting diode to produce light.

There is a trend towards borderless electronic devices with a full-face display. These devices, however, may still need to include sensors such as cameras, ambient light sensors, and proximity sensors to provide other device capabilities. Since the display now covers the entire front face of the electronic device, the sensors will have to be placed under the display stack. In practice, however, the amount of light transmission through the display stack is very low (i.e., the transmission might be less than 20% in the visible spectrum), which severely limits the sensing performance under the display.

It is within this context that the embodiments herein arise.

SUMMARY

An electronic device may include a sensor and a display having a portion that overlaps the sensor. The display may include a substrate, a first organic planarization layer formed over the substrate, a second organic planarization layer formed over the first organic planarization layer, a plurality of anodes for a plurality of display pixels in the portion that overlaps the sensor, and a cathode for the plurality of display pixels. The plurality of anodes may be formed over the second organic planarization layer, the cathode may be formed over the plurality of anodes, the cathode may have a first opening between the plurality of display pixels, and at least a selected one of the first organic planarization layer and the second organic planarization layer may have a second opening that at least partially overlaps the first opening.

An electronic device may include a sensor and a display having a portion that overlaps the sensor. The display may include a substrate, a first organic layer formed over the substrate, a second organic layer formed over the first organic layer, a third organic layer formed over the second organic layer, and a common electrode for a plurality of display pixels in the portion. The first, second, and third organic layers may be interposed between the substrate and the common electrode, the cathode may have a first opening between the plurality of display pixels, and at least one of the first, second, and third organic layers may have a second opening that at least partially overlaps the first opening.

An electronic device may include a sensor and a display having an array of pixels. The display may include a first portion having a first pixel density, a second portion that has a second pixel density that is lower than the first pixel density and that overlaps the sensor, a plurality of anodes for the array of pixels, a common cathode for the array of pixels, wherein the common cathode has a plurality of first openings in the second portion of the display, and at least one organic layer that is formed underneath the common cathode. The at least one organic layer may have a plurality of second openings and each one of the plurality of second openings may be at least partially aligned with one of the plurality of first openings.

DETAILED DESCRIPTION

Figure 1:
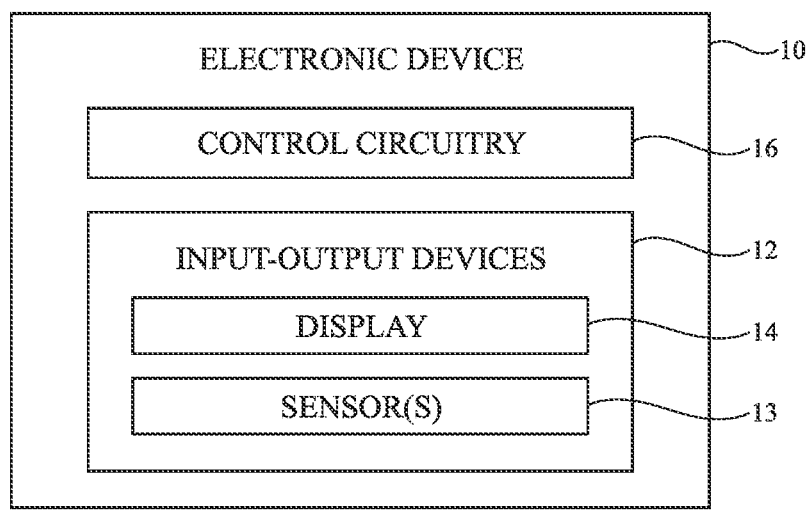
FIG. 1 is a schematic diagram of an illustrative electronic device having a display and one or more sensors in accordance with some embodiments.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid-state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, keypads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Input-output devices 12 may also include one or more sensors 13 such as force sensors (e.g., strain gauges, capacitive force sensors, resistive force sensors, etc.), audio sensors such as microphones, touch and/or proximity sensors such as capacitive sensors (e.g., a two-dimensional capacitive touch sensor associated with a display and/or a touch sensor that forms a button, trackpad, or other input device not associated with a display), and other sensors. In accordance with some embodiments, sensors 13 may include optical sensors such as optical sensors that emit and detect light (e.g., optical proximity sensors such as transreflective optical proximity structures), ultrasonic sensors, and/or other touch and/or proximity sensors, monochromatic and color ambient light sensors, image sensors, fingerprint sensors, temperature sensors, proximity sensors and other sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 13 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

Display 14 may be an organic light-emitting diode display, a display formed from an array of discrete light-emitting diodes (microLEDs) each formed from a crystalline semiconductor die, or any other suitable type of display. Device configurations in which display 14 is an organic light-emitting diode display are sometimes described herein as an example. This is, however, merely illustrative. Any suitable type of display may be used, if desired. In general, display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
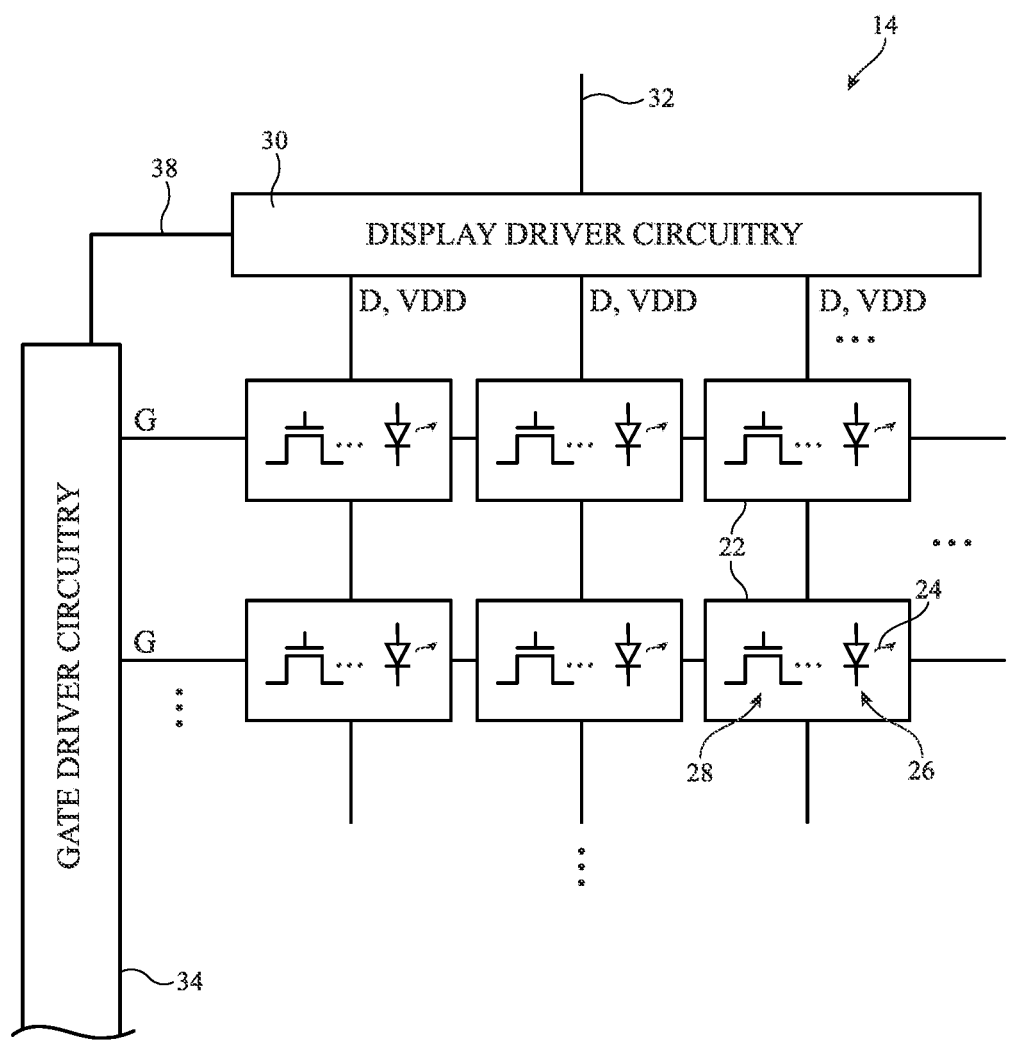
FIG. 2 is a schematic diagram of an illustrative display with light-emitting elements in accordance with some embodiments.

A top view of a portion of display 14 is shown in FIG. 2. As shown in FIG. 2, display 14 may have an array of pixels 22 formed on a substrate. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may include a light-emitting diode 26 that emits light 24 under the control of a pixel control circuit formed from thin-film transistor circuitry such as thin-film transistors 28 and thin-film capacitors. Thin-film transistors 28 may be polysilicon thin-film transistors, semiconducting-oxide thin-film transistors such as indium zinc gallium oxide (IGZO) transistors, or thin-film transistors formed from other semiconductors. Pixels 22 may contain light-emitting diodes of different colors (e.g., red, green, and blue) to provide display 14 with the ability to display color images or may be monochromatic pixels.

Display driver circuitry may be used to control the operation of pixels 22. The display driver circuitry may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply display driver circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, display driver circuitry 30 may also supply clock signals and other control signals to gate driver circuitry 34 on an opposing edge of display 14.

Gate driver circuitry 34 (sometimes referred to as row control circuitry) may be implemented as part of an integrated circuit and/or may be implemented using thin-film transistor circuitry. Horizontal control lines G in display 14 may carry gate line signals such as scan line signals, emission enable control signals, and other horizontal control signals for controlling the display pixels 22 of each row. There may be any suitable number of horizontal control signals per row of pixels 22 (e.g., one or more row control signals, two or more row control signals, three or more row control signals, four or more row control signals, etc.).

The region on display 14 where the display pixels 22 are formed may sometimes be referred to herein as the active area. Electronic device 10 has an external housing with a peripheral edge. The region surrounding the active area and within the peripheral edge of device 10 is the border region. Images can only be displayed to a user of the device in the active region. It is generally desirable to minimize the border region of device 10. For example, device 10 may be provided with a full-face display 14 that extends across the entire front face of the device. If desired, display 14 may also wrap around over the edge of the front face so that at least part of the lateral edges or at least part of the back surface of device 10 is used for display purposes.

Figure 3:
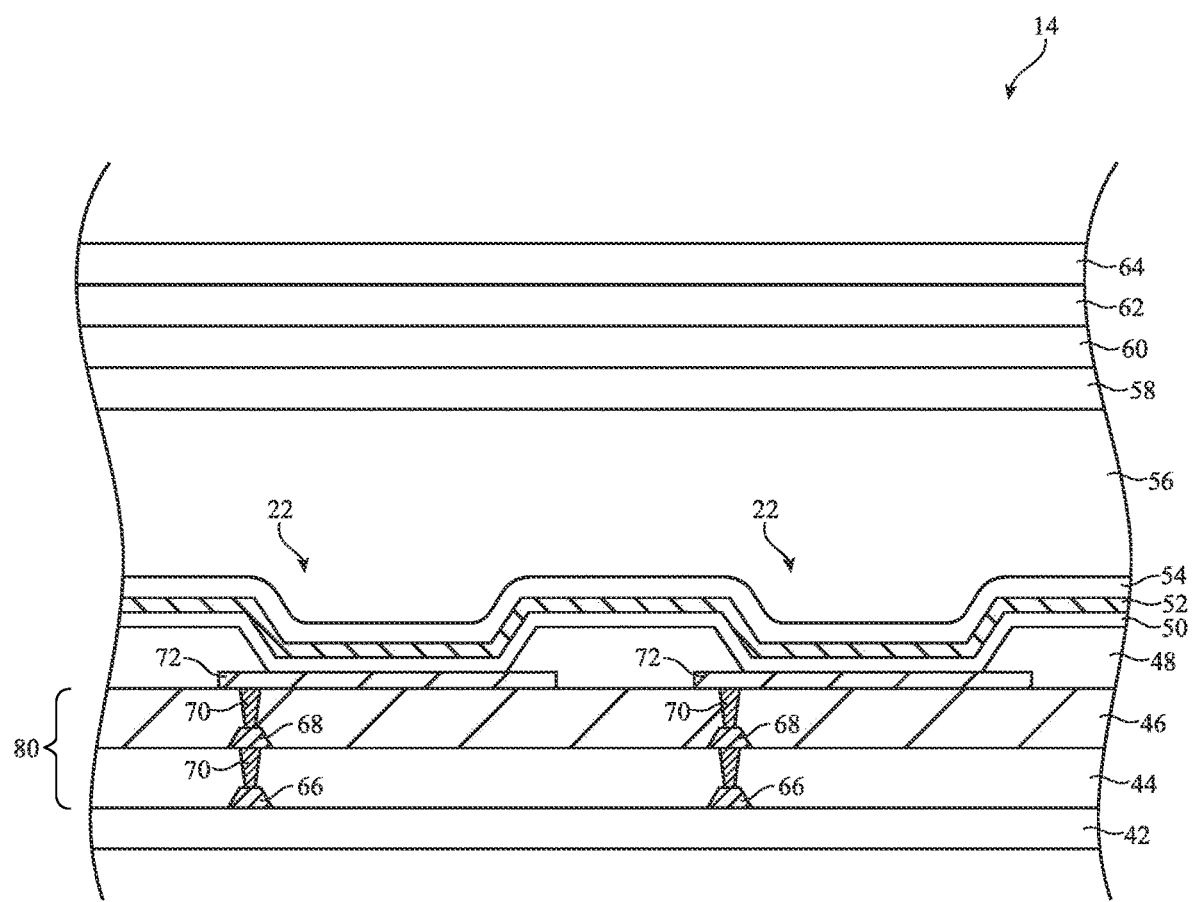
FIG. 3 is a cross-sectional side view of an illustrative display stack in accordance with some embodiments.

FIG. 3 is a cross-sectional side view of an illustrative display stack of display 14. Display 14 may include a substrate such as substrate 42. Substrate 42 may be formed from glass, metal, plastic, ceramic, sapphire, or other suitable substrate materials. In some arrangements, substrate 42 may be an organic substrate formed from polyethylene terephthalate (PET) or polyethylene naphthalate (PEN) (as examples). Substrate 42 may be formed from one or more polyimide (PI) layers. Substrate 42 may include one or more layers of inorganic material (e.g., silicon oxide, silicon nitride, amorphous silicon, etc.). Additional substrate layers may be formed underneath substrate 42 if desired.

Display 14 further includes a first planarization layer 44 and a second planarization layer 46 (sometimes referred to as organic planarization layers 44 and 46) formed over substrate 42. Planarization layers 44 and 46 may be formed from any desired organic material (e.g., polyethylene terephthalate, polyethylene naphthalate, and/or polyimide).

One or more metal layers may be covered by planarization layers 44 and 46. In the example of FIG. 3, a first metal layer 66 is formed on substrate 42 and is covered by planarization layer 44. A second metal layer 68 is formed on planarization layer 44 and is covered by planarization layer 46. One or more conductive vias 70 may electrically connect different portions of the metal layers if desired.

In the example of FIG. 3, an electrode 72 (e.g., anode) is formed on an upper surface of planarization layer 46. Anode 72 is electrically connected to metal layer 68 by a conductive via 70 and metal layer 68 is electrically connected to a metal layer 66 by a conductive via 70.

Metal layers 66 and 68 may form at least a portion of thin-film transistor (TFT) circuitry 80 for display 14. Thin-film transistor circuitry 80 (including metal layers 66 and 68) may be used to form thin-film transistors, thin-film capacitors, associated routing circuitry, and other thin-film structures formed within multiple metal routing layers. TFT circuitry 80 may be used to control an array of display pixels 22 in display 14.

A pixel definition layer 48 may be formed over anode 72 and planarization layer 46. The pixel definition layer 48 may be formed from an organic material if desired. The pixel definition layer may define apertures through which pixels such as pixel 22 in FIG. 3 emit light. The pixel definition layer may be opaque or may be transparent.

Organic light-emitting diode (OLED) layers 50 may be formed over anode 72 and pixel definition layer 48. The OLED layers 50 may be formed as blanket layers across the entire display. This type of arrangement may mitigate the cost and complexity of manufacturing display 14. The OLED layers may optionally have one or more discontinuities to prevent lateral leakage between adjacent OLED pixels. OLED layers 50 may include one or more of a hole injection layer, a hole generation layer, an emissive layer, a charge generation layer, an electronic generation layer, and an electron injection layer.

An additional electrode 52 (e.g., a cathode) is formed over OLED layers 50. Electrode 52 may be a common electrode that serves as the cathode for multiple pixels within display 14. Each pixel 22 is therefore defined by OLED layers 50 that are interposed between a respective anode 72 and the common cathode 52. Cathode 52 may transmit less than 90% of light at a wavelength of interest (e.g., infrared, visible, and/or ultraviolet light), may transmit less than 80% of light, may transmit less than 70% of light, may transmit less than 60% of light, may transmit less than 50% of light, may transmit more than 40% of light, may transmit more than 50% of light, may transmit more than 60% of light, may transmit between 40% and 80% of light, may transmit between 45% and 60% of light, may transmit between 60% and 70% of light, may transmit between 50% and 75% of light, etc. Cathode 52 may reflect more than 10% of light, may reflect more than 20% of light, may reflect more than 30% of light, may reflect more than 40% of light, may reflect more than 50% of light, may reflect more than 60% of light, may reflect less than 50% of light, may reflect less than 60% of light, may reflect between 20% and 60% of light, may reflect between 40% and 55% of light, may reflect between 30% and 40% of light, may reflect between 25% and 50% of light, etc. Cathode 52 may optionally be formed from a transparent conductive material having a transmission that is greater than 90%, greater than 95%, greater than 97%, greater than 99%, etc.

One or more encapsulation layers such as encapsulation layers 54, 56, and 58 may be formed over cathode 52. Encapsulation layer 54 may be formed from an inorganic material and may sometimes be referred to as passivation layer 54, inorganic layer 54, inorganic passivation layer 54, inorganic encapsulation layer 54, etc. Encapsulation layer 56 may be formed from an organic material and may sometimes be referred to as planarization layer 56, organic layer 56, organic planarization layer 56, organic encapsulation layer 56, etc. Encapsulation layer 58 may be formed from an inorganic material and may sometimes be referred to as passivation layer 58, inorganic layer 58, inorganic passivation layer 58, inorganic encapsulation layer 58, etc. Encapsulation layers 54, 56, and 58 may help prevent moisture and other potential contaminants from damaging the conductive circuitry that is covered by layers 54, 56, and 58.

One or more polarizer films 60 may be formed over encapsulation layer 58. One or more touch layers 62 that implement the touch sensor functions of touch-screen display 14 may be formed over polarizer films 60. For example, touch layers 62 may include horizontal touch sensor electrodes and vertical touch sensor electrodes collectively forming an array of capacitive touch sensor electrodes. The display stack may be topped off with a cover glass layer 64 (sometimes referred to as a display cover layer 64) that is formed over the touch layers 62. Display cover layer 64 may be a transparent layer (e.g., transparent plastic or glass) that serves as an outer protective layer for display 14. The outer surface of display cover layer 64 may form an exterior surface of the display and the electronic device that includes the display.

One or more layers of adhesive (e.g., optically clear adhesive) may be incorporated into display 14 to attach adjacent layers within the display. For example, optically clear adhesive (OCA) may be included between polarizer layer 60 and touch sensor layer 62, between touch sensor layer 62 and display cover layer 64, and/or at other desired locations within display.

It should be noted that the display stack in FIG. 3 may include a black masking layer to mitigate undesired reflections off the display stack. One or more black masking layers may be incorporated at any desired location within the display stack. A black masking layer may be incorporated above one or more of cathode 52, encapsulation layer 54, encapsulation layer 56, encapsulation layer 58, polarizer 60, etc.

Figure 4:
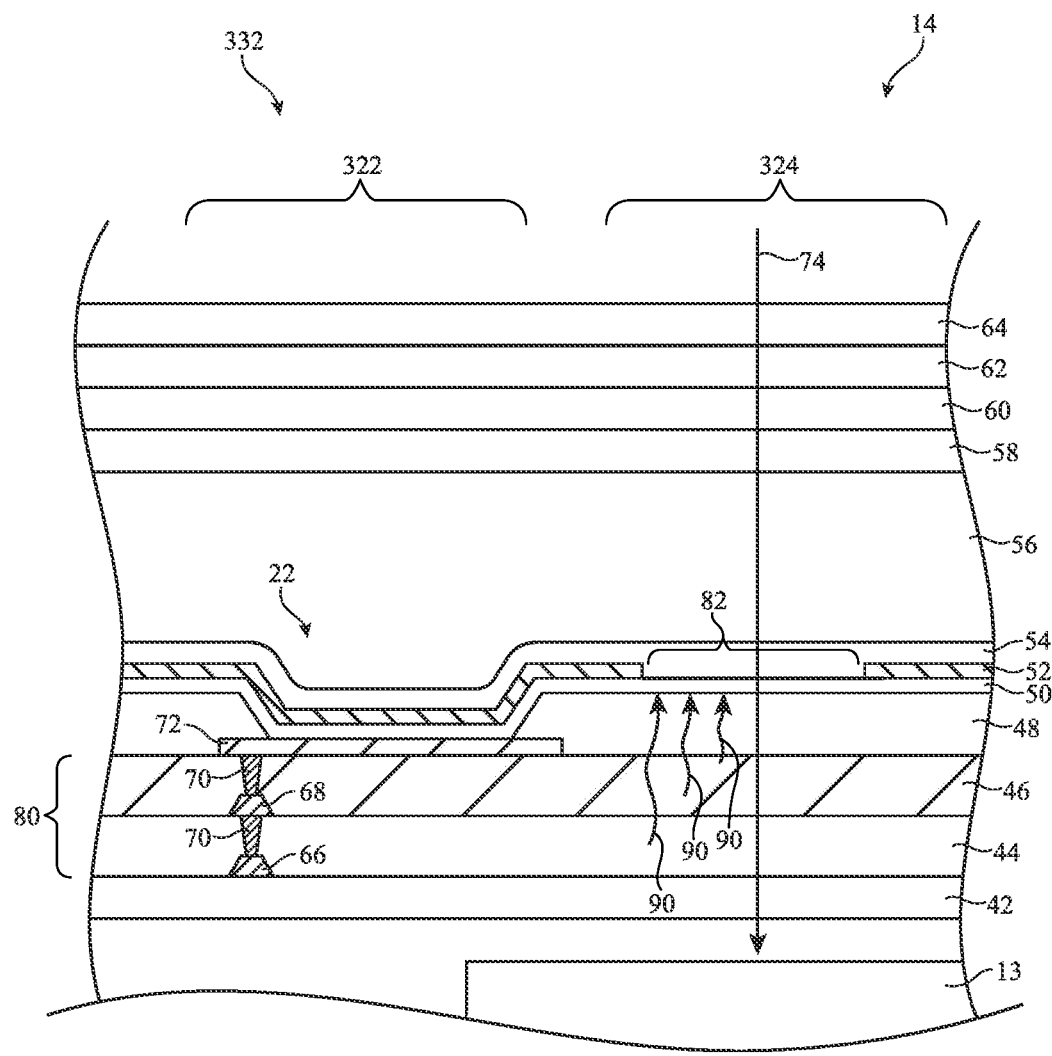
FIG. 4 is a cross-sectional side view of an illustrative display stack that at least partially covers an input-output component in accordance with some embodiments.

In some arrangements, a sensor may be positioned underneath display 14. FIG. 4 is a cross-sectional side view of a display of this type. The display of FIG. 4 has common elements from FIG. 3 that, for simplicity, will not be described again in connection with FIG. 3. In FIG. 4, a pixel is omitted relative to in FIG. 3, a portion of cathode 52 is removed, and a sensor 13 is formed underneath the display stack.

As shown in FIG. 4, sensor 13 may be formed under the display stack within the electronic device. As described above in connection with FIG. 1, sensor 13 may be an optical sensor such as a camera, proximity sensor, ambient light sensor, fingerprint sensor, or other light-based sensor. In some cases, sensor 13 may include a light-emitting component (light source) that emits light through the display. Sensor 13 may therefore sometimes be referred to as input-output component 13. Input-output component 13 may be a sensor or a light source (e.g., that is part of a sensor). The performance of input-output component 13 depends on the transmission of light traversing through the display stack, as indicated by arrow 74. A typical display stack, however, may have lower transmission than desired. For instance, more than 80% of light in the visible and infrared light spectrum might be lost when traveling through the display stack of FIG. 3, which makes sensing under display 14 challenging.

Each of the multitude of layers in the display stack contributes to the degraded light transmission to sensor 13. In particular, the dense thin-film transistors and associated routing structures (e.g., TFT circuitry 80 including metal layers 66 and 68) of the display stack contribute substantially to the low transmission. In accordance with an embodiment, at least some of the display pixels may be selectively removed in regions of the display stack located directly over sensor(s) 13. Regions of display 14 that at least partially cover or overlap with sensor(s) 13 in which at least a portion of the display pixels have been removed are sometimes referred to as pixel removal regions or low density pixel regions. Removing display pixels (e.g., removing transistors and/or capacitors associated with one or more sub-pixels) in the pixel removal regions can help increase transmission and improve the performance of the under-display sensor 13.

FIG. 4 shows how pixels may be removed in a pixel removal region 332 to increase transmission through the display. As shown in FIG. 4, display 14 may include a pixel region 322 and a high-transmittance area 324. In the pixel region 322, the display may include a pixel 22 formed from OLED layers 50 that are interposed between an anode 72 and cathode 52. Signals may be selectively applied to anode 72 to cause emissive material within OLED layers 50 to emit light for the pixel. TFT circuitry 80 including metal layers 66 and 68 may be used to control the signals applied to anode 72.

In high-transmittance area 324, anode 72 may be omitted. Without the high-transmittance area, an additional pixel may be formed in area 324 adjacent to the pixel in area 322 (similar to as shown in FIG. 3). However, to increase the transmittance of light to sensor 13 under the display, the pixels in area 324 in FIG. 4 are removed. The absence of anode 72 may increase the transmittance through the display stack. Additional circuitry within thin-film transistor layer 80 may also be omitted in high-transmittance area 324 to increase transmittance.

Additional transmission improvements through the display stack may be obtained by selectively removing additional components from the display stack in high-transmittance area 324. As shown in FIG. 4, a portion of cathode 52 may be removed in high-transmittance area 324. This results in an opening 82 in the cathode 52. Said another way, the cathode 52 may have conductive material that defines openings 82 in the pixel removal region. Removing the cathode in this way allows for more light to pass through the display stack to sensor 13 (or to pass through the display stack from component 13 towards a viewer in embodiments where input-output component 13 emits light). Cathode 52 may be formed from any desired conductive material. The cathode may be removed via etching (e.g., laser etching or plasma etching). Alternatively, the cathode may be patterned to have an opening in high-transmittance areas 324 during the original cathode deposition and formation steps.

The example in FIGS. 3 and 4 of the display stack including OLED layers is merely illustrative. As previously noted, the display stack may include pixels formed using other display technology. For example, the display stack may include an array of discrete light-emitting diodes each formed from a crystalline semiconductor die (e.g., an array of microLEDs).

Figure 5:
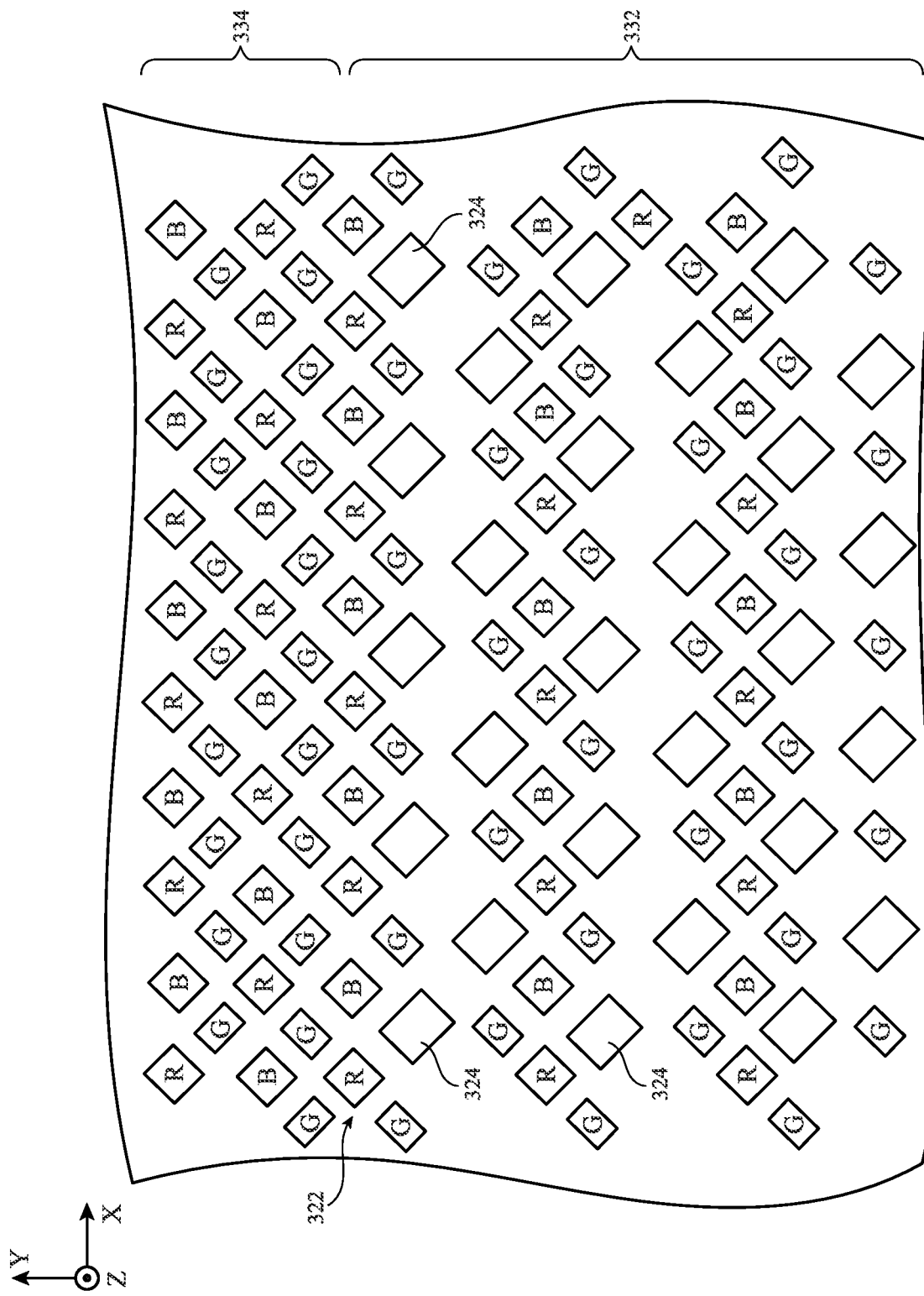
FIG. 5 is a top view of an illustrative display with transparent openings that overlap a sensor in accordance with some embodiments.

FIG. 5 is a top view of an illustrative display showing how high-transmittance areas may be incorporated into a pixel removal region 332 of the display. As shown, the display may include a plurality of pixels. In FIG. 5, there are a plurality of red pixels (R), a plurality of blue pixels (B), and a plurality of green pixels (G). The red, blue, and green pixels may be arranged in any desired pattern. Different nomenclature may be used to refer to the red, green, and blue pixels in the display. As one option, the red, blue, and green pixels may be referred to simply as pixels. As another option, the red, blue, and green pixels may instead be referred to as red, blue, and green sub-pixels. In this example, a group of sub-pixels of different colors may be referred to as pixel. In high-transmittance areas 324, no sub-pixels are included in the display (even though sub-pixels would normally be present if the normal sub-pixel pattern was followed).

No pixels are removed from full pixel density region 334. Pixels are removed in pixel removal region 332 relative to full pixel density region 334. To provide a uniform distribution of sub-pixels across the display surface, an intelligent pixel removal process may be implemented for region 332 that systematically eliminates the closest sub-pixel of the same color (e.g., the nearest neighbor of the same color may be removed). The pixel removal process may involve, for each color, selecting a given sub-pixel, identifying the closest or nearest neighboring sub-pixels of the same color (in terms of distance from the selected sub-pixel), and then eliminating/omitting those identified sub-pixels in the final pixel removal region. With this type of arrangement, there may be high-transmittance areas in the pixel removal region, allowing a sensor or light-emitting component to operate through the display in the pixel removal region. Additionally, because some of the pixels remain present in the pixel removal region (e.g., 50% of the pixels in the layout of FIG. 5), the pixel removal region may not have a perceptibly different appearance from the rest of the display for a viewer.

As shown in FIG. 5, display 14 may include an array of high-transmittance areas 324 in pixel removal region 332. Each high-transmittance area 324 may have pixels removed in that area. Each high-transmittance area also has an increased transparency compared to pixel regions 322. The high-transmittance areas 324 may sometimes be referred to as transparent windows 324, transparent display windows 324, transparent openings 324, transparent display openings 324, etc. The transparent display windows may allow for light to be transmitted through the display to an underlying sensor or for light to be transmitted through the display from a light source underneath the display. The transparency of transparent openings 324 (for ultraviolet, visible, and/or infrared light) may be greater than 25%, greater than 30%, greater than 40%, greater than 50%, greater than 60%, greater than 70%, greater than 80%, greater than 90%, etc. The transparency of transparent openings 324 may be greater than the transparency of pixel region 322. The transparency of pixel region 322 may be less than 25%, less than 20%, less than 10%, less than 5%, etc. The pixel region 322 may sometimes be referred to as opaque display region 322, opaque region 322, opaque footprint 322, etc. Opaque region 322 includes light emitting pixels R. G, and B, and blocks light from passing through the display.

The pattern of pixels (322) and high-transmittance areas (324) in FIG. 5 is merely illustrative. In FIG. 5, discrete high-transmittance areas 324 are depicted. However, it should be understood that these high-transmittance areas may form larger, unitary transparent openings if desired.

The pattern of sub-pixels and pixel removal regions in FIG. 5 is merely illustrative. In FIG. 5, the display edge may be parallel to the X axis or the Y axis. The front face of the display may be parallel to the XY plane such that a user of the device views the front face of the display in the Z direction. In FIG. 5, every other sub-pixel may be removed for each color within pixel removal region 332. The resulting pixel configuration has 50% of the sub-pixels removed. In FIG. 5, the remaining pixels follow a zig-zag pattern across the display (with two green sub-pixels for every one red or blue sub-pixel). In FIG. 5, the sub-pixels have edges angled relative to the edges of the display (e.g., the edges of the sub-pixels are at non-zero, non-orthogonal angles relative to the X-axis and Y-axis). This example is merely illustrative. If desired, each individual sub-pixel may have edges parallel to the display edge, a different proportion of pixels may be removed for different colors, the remaining pixels may follow a different pattern, etc.

Figure 6A:
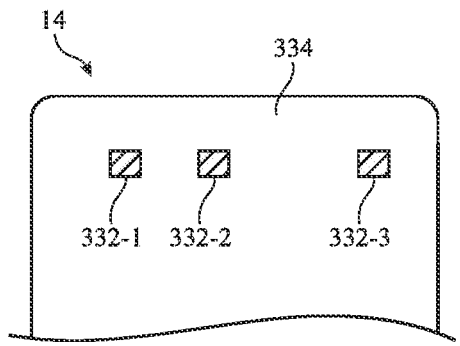
FIGS. 6A-6F are top views of illustrative displays showing possible positions for pixel removal regions in accordance with some embodiments.

In general, the display sub-pixels may be partially removed from any region(s) of display 14. FIGS. 6A-6F are front views showing how display 14 may have one or more localized pixel removal regions in which the sub-pixels are selectively removed. The example of FIG. 6A illustrates various local pixel removal regions 332 (sometimes referred to as low pixel density regions) physically separated from one another (i.e., the various pixel removal regions 332 are non-continuous) by full pixel density region 334. The full pixel density region 334 (sometimes referred to as full pixel density area 334) does not include any transparent windows 324 (e.g., none of the sub-pixels are removed and the display follows the pixel pattern without modifications). The full pixel density region 334 has a higher pixel density (pixels per unit area) than low pixel density regions 332. The three pixel removal regions 332-1, 332-2, and 332-3 in FIG. 6A might for example correspond to three different sensors formed underneath display 14 (with one sensor per pixel removal region).

Figure 6B:
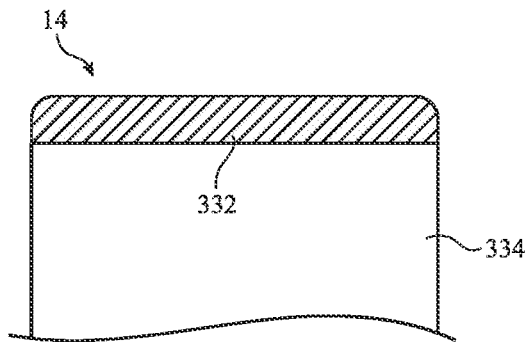
Figure 6C:
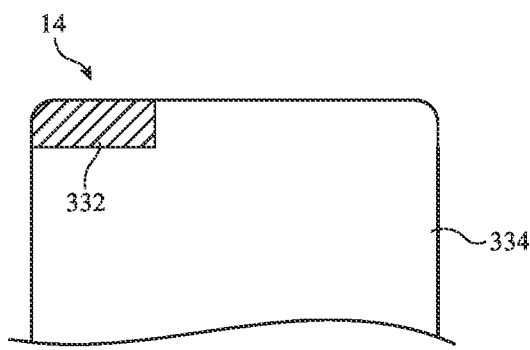
Figure 6D:
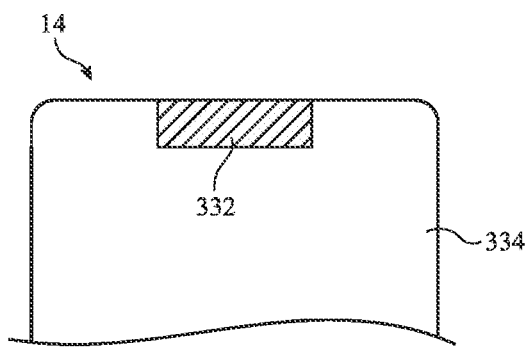
Figure 6E:
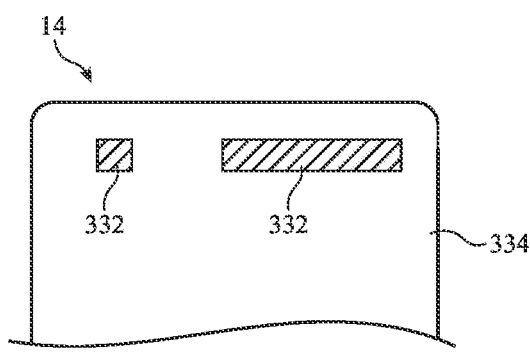
Figure 6F:
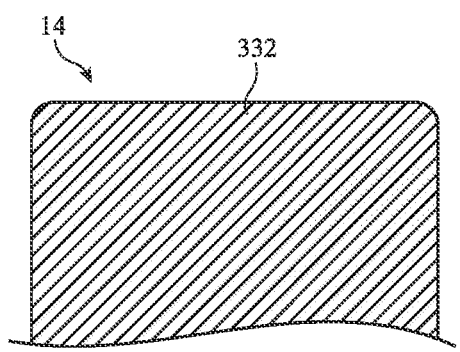

The example of FIG. 6B illustrates a continuous pixel removal region 332 formed along the top border of display 14, which might be suitable when there are many optical sensors positioned near the top edge of device 10. The example of FIG. 6C illustrates a pixel removal region 332 formed at a corner of display 14 (e.g., a rounded corner area of the display). In some arrangements, the corner of display 14 in which pixel removal region 332 is located may be a rounded corner (as in FIG. 6C) or a corner having a substantially 90° corner. The example of FIG. 6D illustrates a pixel removal region 332 formed only in the center portion along the top edge of device 10 (i.e., the pixel removal region covers a recessed notch area in the display). FIG. 6E illustrates another example in which pixel removal regions 332 can have different shapes and sizes. FIG. 6F illustrates yet another suitable example in which the pixel removal region covers the entire display surface. These examples are merely illustrative and are not intended to limit the scope of the present embodiments. If desired, any one or more portions of the display overlapping with optically based sensors or other sub-display electrical components may be designated as a pixel removal region/area.

The example in FIG. 5 of pixels being removed in region 332 is merely illustrative. Alternatively, the size of the pixels in region 332 may be decreased relative to region 334 to increase the transparency in region 332 relative to region 334. Region 332 may therefore sometimes be referred to as high-transparency region 332, increased transparency region 332, or modified region 332 instead of pixel removal region 332. There may be at least one modification to region 332 relative to region 334 (e.g., cathode removal, pixel removal, pixel shrinkage, etc.) that increases transparency through the display.

Returning to FIG. 4, removing a portion of cathode 52 in opening 82 may allow more light to reach sensor 13. This may be desirable to increase the signal-to-noise ratio of sensor 13. However, in addition to allowing a higher transmission of a target type of light to sensor 13 (e.g., visible light or infrared light), the cathode opening 82 may allow a higher transmission of other light (e.g., ultraviolet light).

Cathode 52 may reflect ultraviolet light in regions of display 14 that include cathode 52 (e.g., in pixel region 322). However, in opening 82, ultraviolet light may pass through the cathode opening and reach underlying layers such as pixel definition layer 48, planarization layer 46, and planarization layer 44. Pixel definition layer 48, planarization layer 46, and planarization layer 44 may be formed from organic materials and may be subject to outgassing when exposed to ultraviolet light. When outgassing occurs, contaminants (e.g., water, carbon monoxide, etc.) may diffuse (e.g., in direction 90 in FIG. 4) from the organic layer to OLED layers 50.

In portions of the display covered by cathode 52, exposure to ultraviolet light is low and outgassing is therefore limited and does not have a substantial impact on display performance. However, in regions under opening 82, the increased ultraviolet light exposure may cause increased outgassing levels. The increased outgassing levels may cause degradation of the OLED layers 50, ultimately reducing the brightness of the pixels (particularly at the edges of the pixels).

Each organic layer under cathode opening 82 may be susceptible to outgassing. Therefore, to mitigate display artifacts caused by outgassing, one or more organic layers under cathode opening 82 may be at least partially removed.

Figure 7:
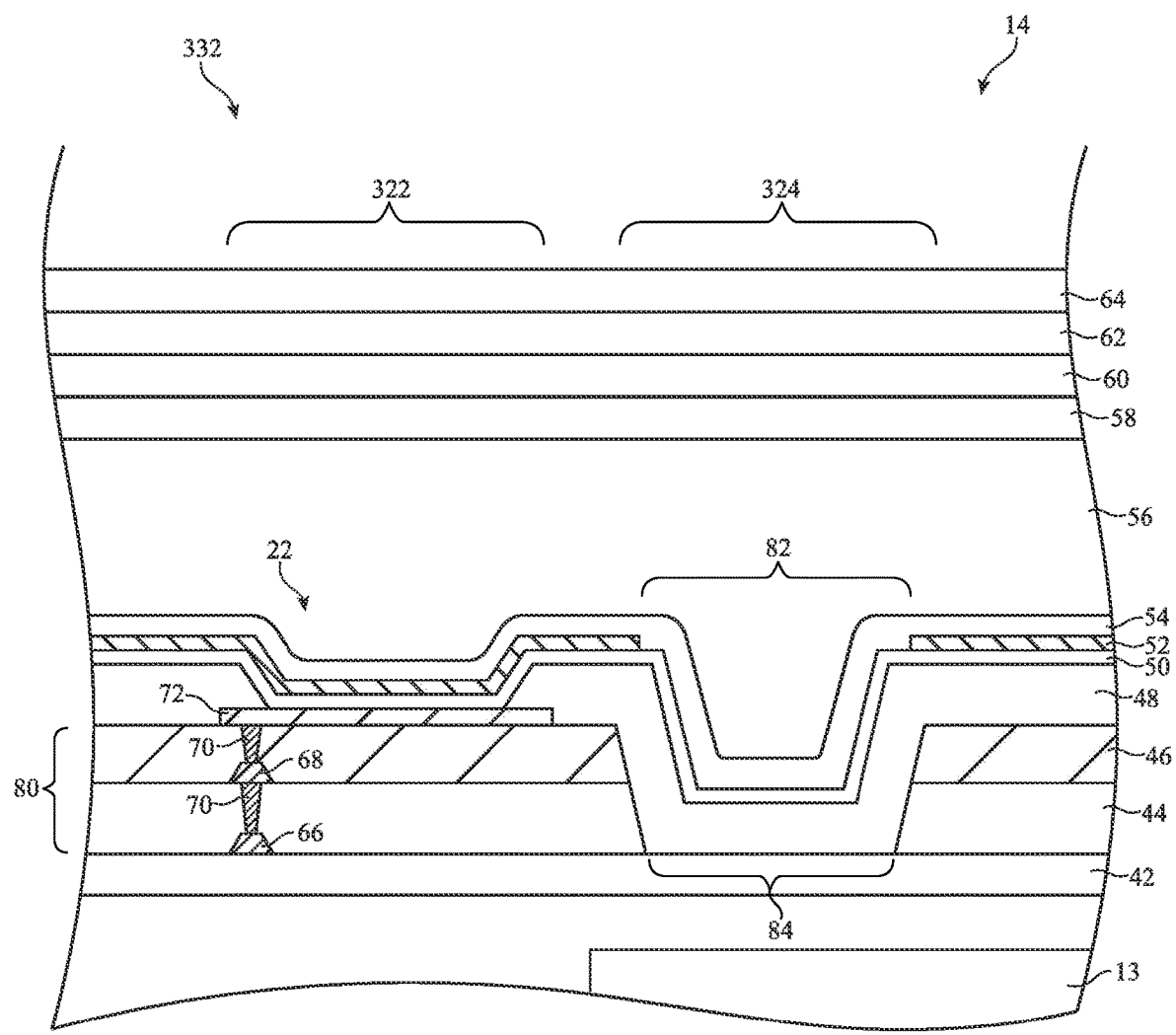
FIG. 7 is a cross-sectional side view of an illustrative display with an opening in first and second organic planarization layers under a cathode opening in accordance with some embodiments.

FIG. 7 is a cross-sectional side view of an illustrative display with omitted organic planarization layers underneath a cathode opening. As shown in FIG. 7, cathode 52 includes opening 82 (similar to as shown in FIG. 4). Additionally, there is an opening 84 in organic planarization layers 44 and 46. Said another way, the organic planarization layers 44 and 46 may define one or more openings 84 in the pixel removal region 332. Each organic planarization layer opening 84 may be at least partially overlapped by a respective cathode opening 82.

Pixel definition layer 48, planarization layer 46, and planarization layer 44 may all be susceptible to outgassing. However, planarization layer 46 and planarization layer 44 may be more susceptible to outgassing than pixel definition layer 48. As one example, pixel definition layer 48 may be less susceptible to outgassing than planarization layers 44 and 46 due to a bleaching process (applied to layer 48 but not layers 44 and 46) that reduces contaminants in the pixel definition layer 48 during manufacturing. As another example, pixel definition layer 48 may be less susceptible to outgassing than planarization layers 44 and 46 due to a lower thickness than layers 44 and 46. The thickness of pixel definition layer 48 may be lower than the thickness of planarization layer 44 by at least 3%, at least 5%, at least 10%, at least 30%, at least 50%, at least 75%, etc. The thickness of pixel definition layer 48 may be lower than the thickness of planarization layer 46 by at least 3%, at least 5%, at least 10%, at least 30%, at least 50%, at least 75%, etc.

In FIG. 7, the organic layers under cathode opening 82 that are most susceptible to outgassing (planarization layers 44 and 46) are completely removed. Pixel definition layer 48 (which is less susceptible to outgassing) is not removed under cathode opening 82 and extends continuously through opening 84. Pixel definition layer 48 extends continuously across high-transmittance area 324. Pixel definition layer 48 directly contacts substrate 42 in opening 84. In the example of FIG. 7, OLED layers 50 also extend continuously through opening 84 and across high-transmittance area 324. This example is merely illustrative and the OLED layers 50 may be selectively removed in high-transmittance area 324 if desired. When the OLED layers 50 are selectively removed in high-transmittance area 324, encapsulation layer 54 may directly contact pixel definition layer 48 in opening 84.

Figure 8:
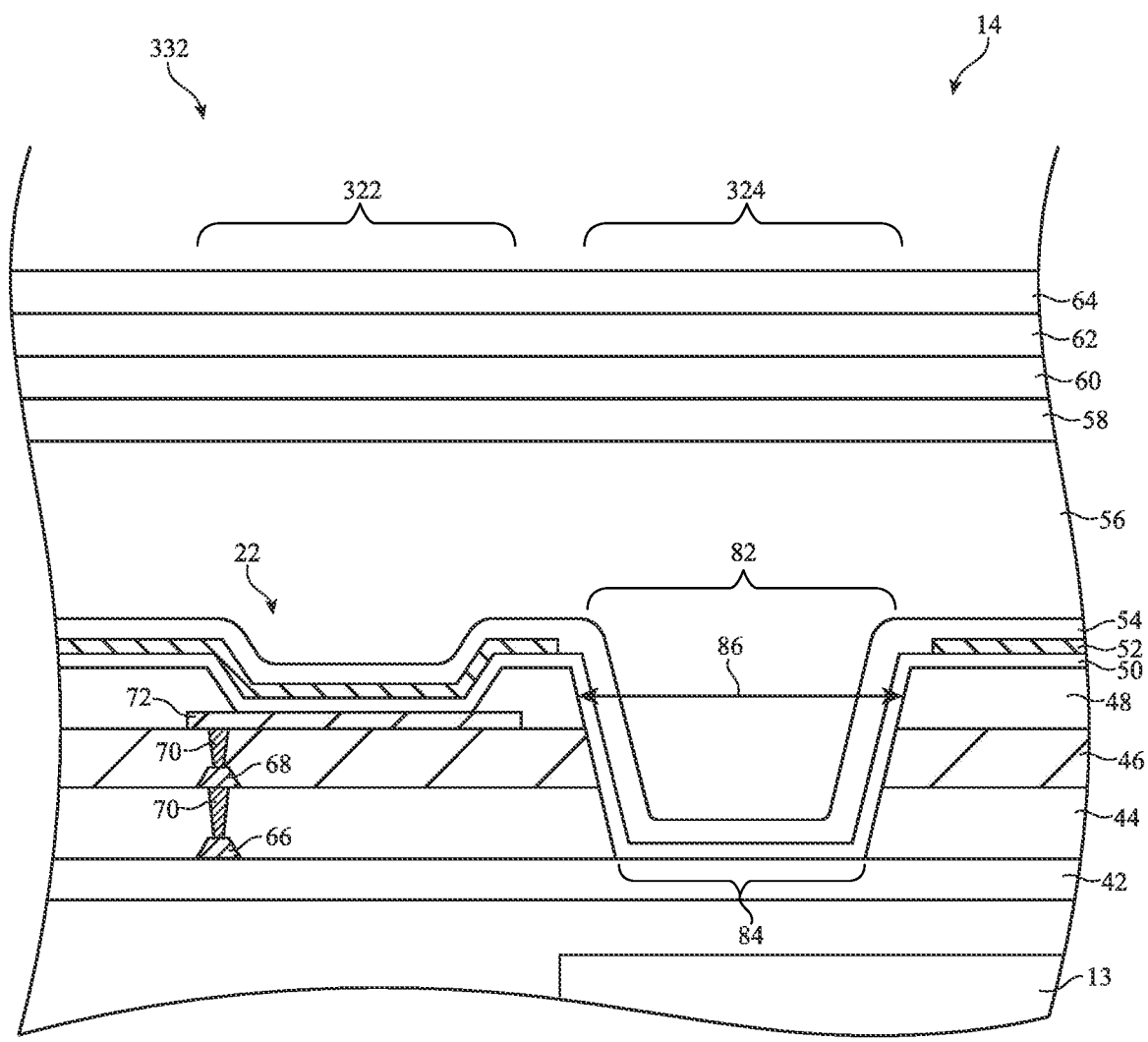
FIG. 8 is a cross-sectional side view of an illustrative display with an opening in a pixel definition layer and first and second organic planarization layers under a cathode opening in accordance with some embodiments.

The example of FIG. 7 is merely illustrative. If desired, pixel definition layer 48 may be removed under cathode opening 82 in addition to planarization layers 44 and 46. FIG. 8 is a cross-sectional side view of an illustrative display where pixel definition layer 48, planarization layer 46, and planarization layer 44 are all removed under cathode opening 82. As shown in FIG. 8, there is an opening 86 in pixel definition layer 48 in addition to opening 84 in planarization layers 44 and 46. Said another way, the pixel definition layer 48 may define one or more openings 86 in the pixel removal region 332.

In the example of FIG. 8, OLED layers 50 are not removed under cathode opening 82 and extend continuously through openings 84/86. OLED layers 50 extends continuously across high-transmittance area 324. OLED layers 50 directly contact substrate 42 in opening 84. This example is merely illustrative and the OLED layers 50 may be selectively removed in high-transmittance area 324 if desired. When the OLED layers 50 are selectively removed in high-transmittance area 324, encapsulation layer 54 may directly contact substrate 42 in opening 84.

Figure 9:
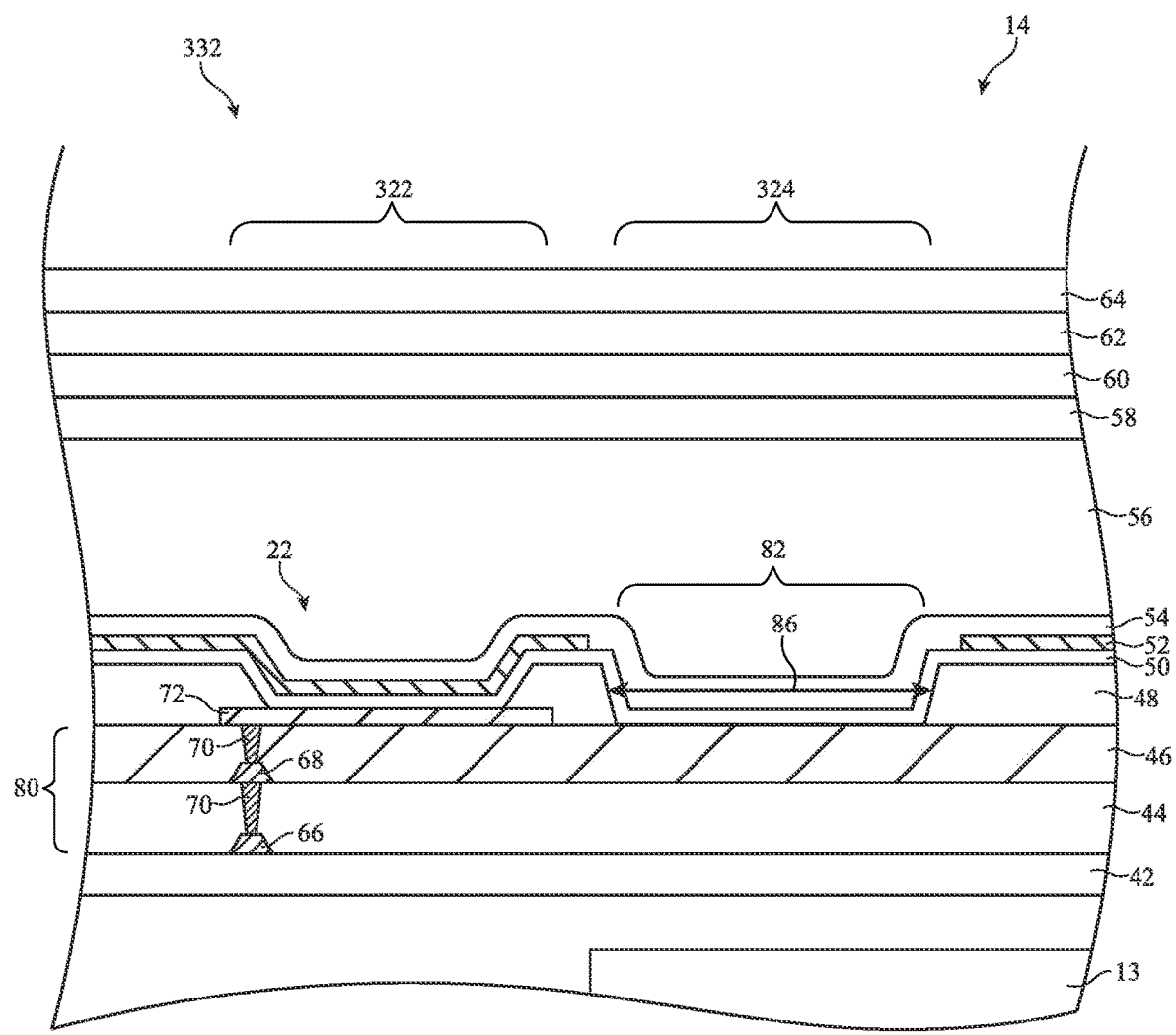
FIG. 9 is a cross-sectional side view of an illustrative display with an opening in a pixel definition layer under a cathode opening in accordance with some embodiments.

In yet another possible arrangement, shown in FIG. 9, pixel definition layer 48 may be removed under cathode opening 82 and planarization layers 44 and 46 may not be removed under cathode opening 82. As shown in FIG. 9, there is an opening 86 in pixel definition layer 48 below cathode opening 82. However, planarization layers 44 and 46 are not removed under cathode opening 82 and extend continuously under opening 86 and across high-transmittance area 324.

In FIG. 9, OLED layers 50 extend continuously across high-transmittance area 324. OLED layers 50 directly contact planarization layer 46 in opening 86. This example is merely illustrative and the OLED layers 50 may be selectively removed in high-transmittance area 324 if desired. When the OLED layers 50 are selectively removed in high-transmittance area 324, encapsulation layer 54 may directly contact substrate planarization layer 46 in opening 86.

Figure 10:
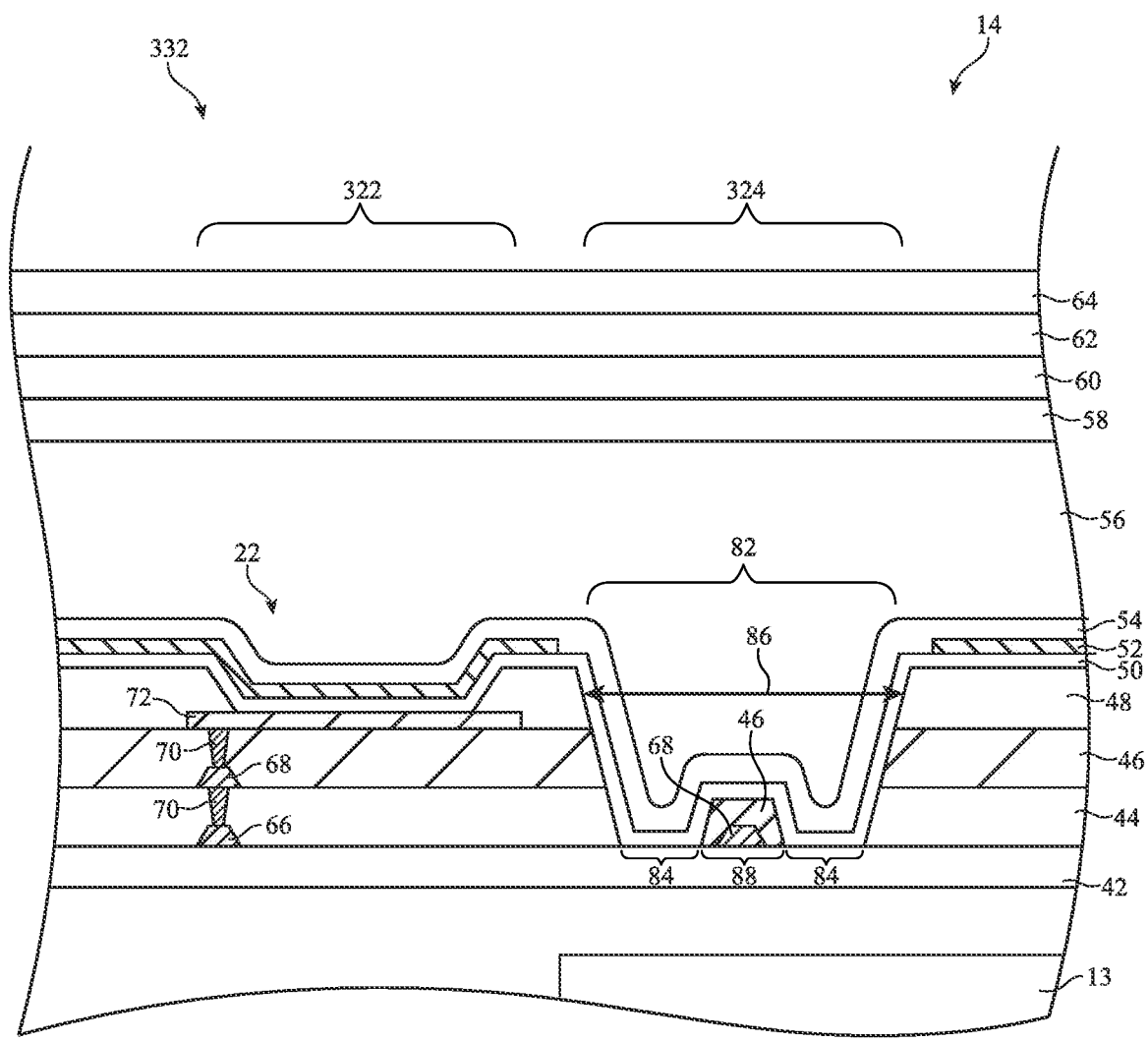
FIG. 10 is a cross-sectional side view of an illustrative display with a region under a cathode opening that includes a metal layer in accordance with some embodiments.

FIG. 10 shows how high-transmittance area 324 may include portions of a metal layer such as metal layer 68. Metal layer 68 within the high-transmittance area may, for example, form signal lines for display 14. In the example of FIG. 10, planarization layer 44 and metal layer 66 are completely omitted in high-transmittance area 324. In region 88, however, a portion of metal layer 68 (formed from the same material and in a common deposition step as the remaining portions of metal layer 68) is formed directly on substrate 42. A portion of planarization layer 46 (formed from the same material and in a common deposition step as the remaining portions of planarization layer 46) is formed over the portion of metal layer 68 in region 88 of high-transmittance area 324. On either side of region 88, openings 84 that extend completely through planarization layers 44 and 46 are formed. No portions of metal layers 66 and 68 are formed above openings 84. In FIG. 10, pixel definition layer 48 has an opening 86 that extends across the high-transmittance area 324.

In the arrangement of FIG. 10, only one planarization layer is included over metal layer portions in the high-transmittance area (e.g., under cathode opening 82). This example is merely illustrative. In another possible arrangement, two planarization layers and two metal layers may be included in some portions under cathode opening 82.

In the arrangement of FIG. 10, metal layer 68 and planarization layer 46 are included in region 88 under cathode opening 82 (whereas metal layer 66 and planarization layer 44 are omitted in region 88). The opposite arrangement may instead be used if desired, with metal layer 66 and planarization layer 44 included in region 88 under cathode opening 82 (whereas metal layer 68 and planarization layer 46 are omitted in region 88).

In general, any desired combination of organic layers underneath cathode opening 82 may be removed to mitigate display artifacts caused by outgassing.

Figure 11:
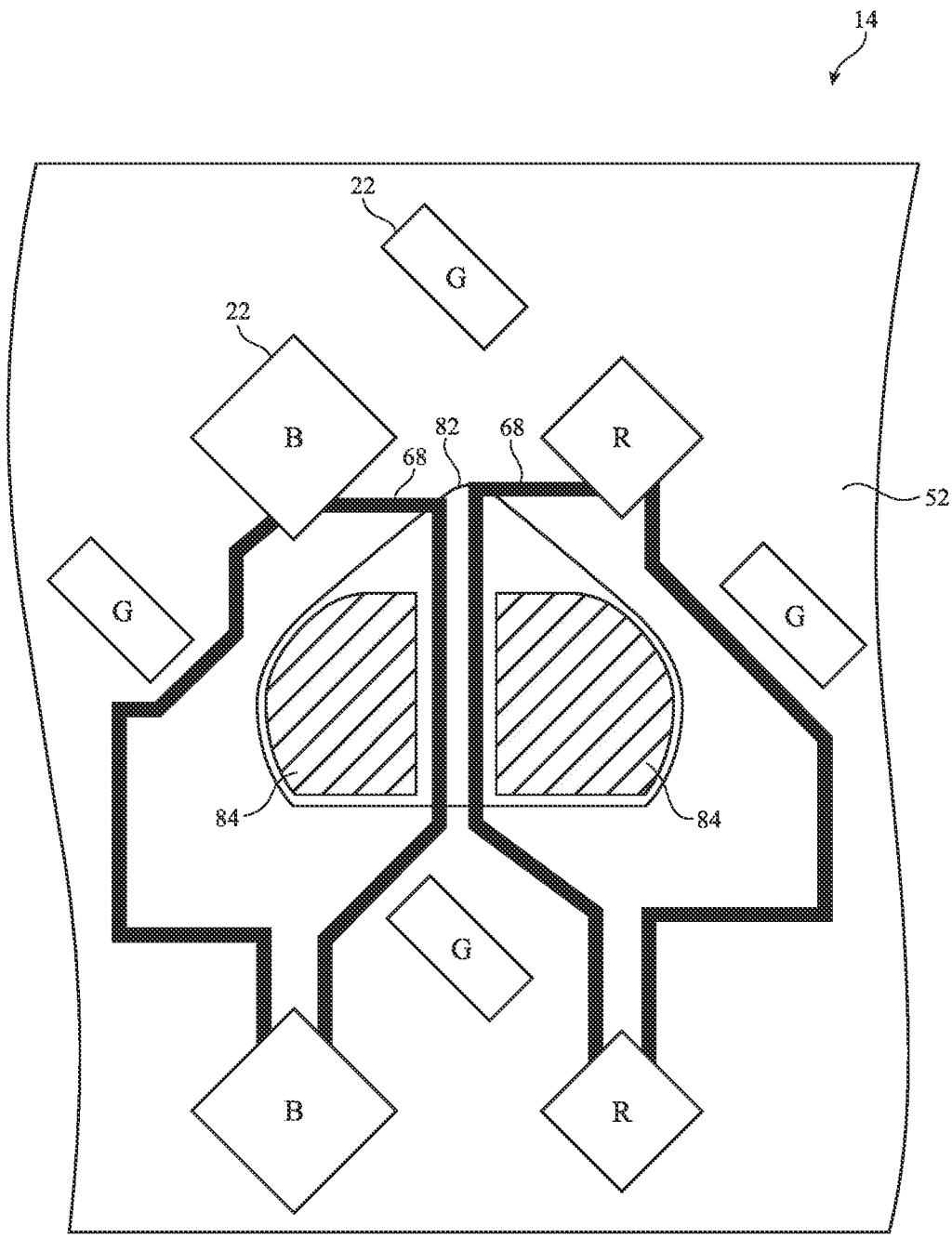
FIG. 11 is a top view of an illustrative display with one or more organic layer openings that have footprints entirely contained within the footprint of a cathode opening in accordance with some embodiments.
Figure 12:
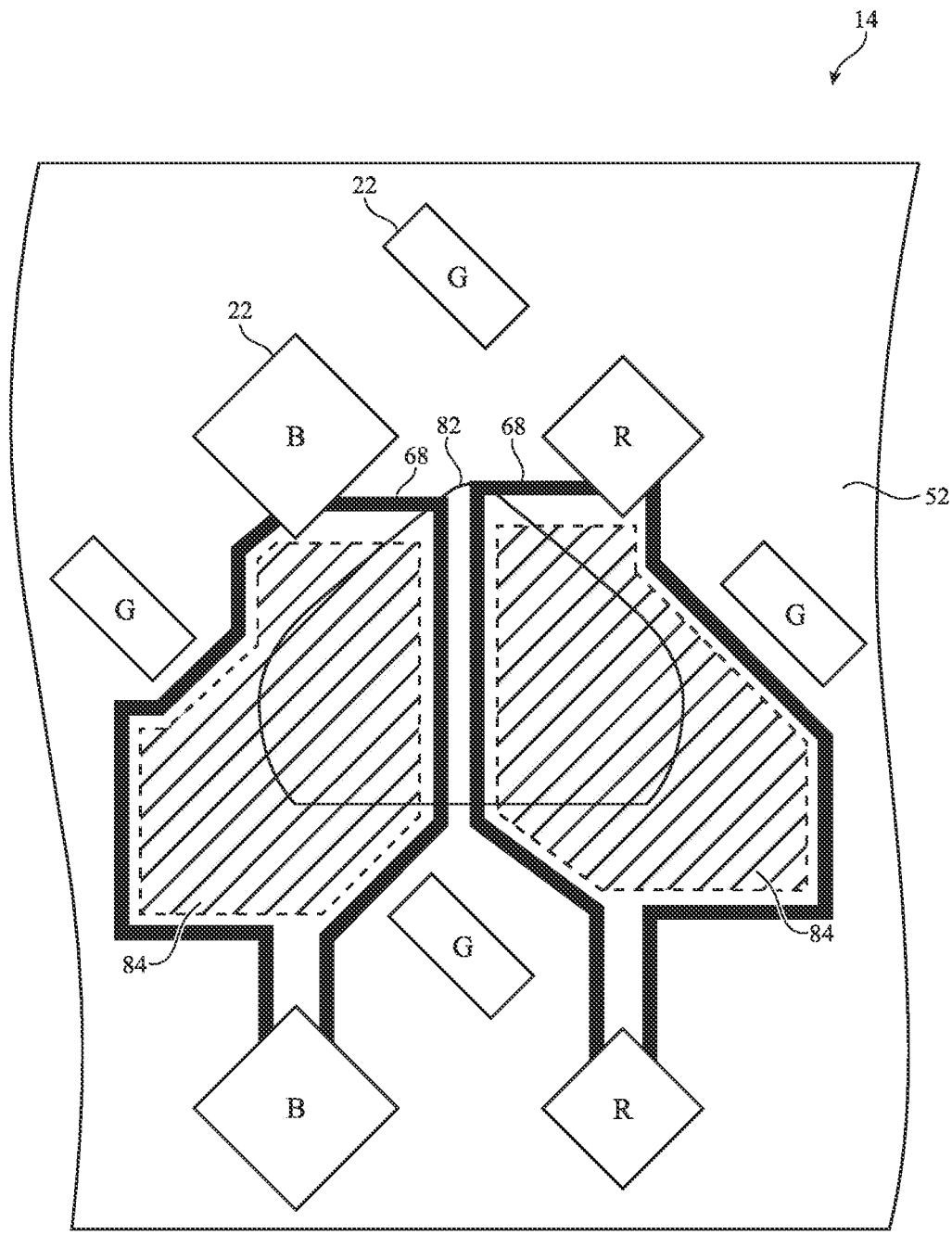
FIG. 12 is a top view of an illustrative display with one or more organic layer openings that have footprints that extend past the footprint of a cathode opening in accordance with some embodiments.
Figure 13:
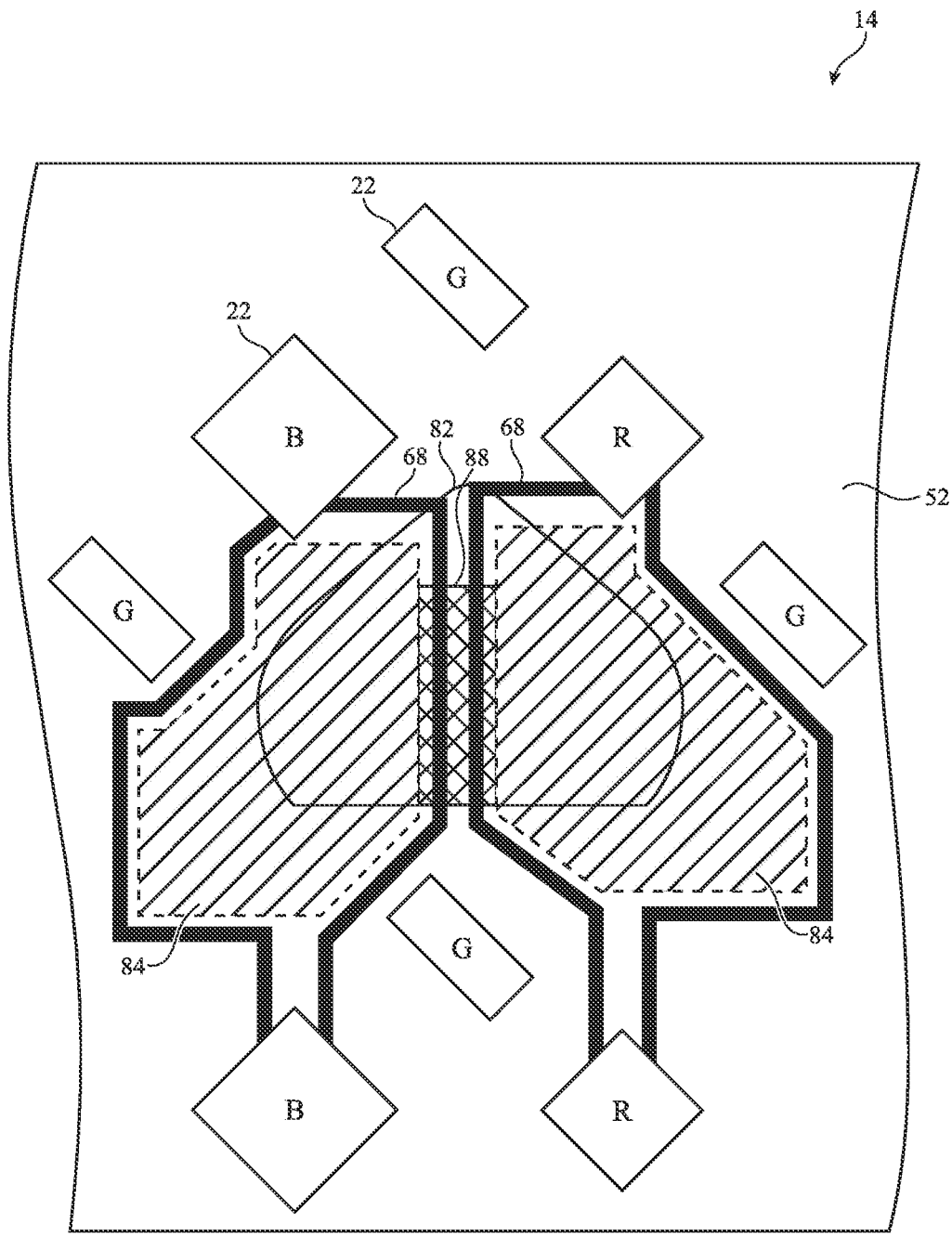
FIG. 13 is a top view of an illustrative display with a region under a cathode opening that includes a metal layer and only one of two organic planarization layers in accordance with some embodiments.

FIGS. 11-13 are top views of illustrative displays with one or more organic layer openings that overlap a cathode opening. As shown in FIG. 11, display 14 may include a cathode opening 82 (e.g., in a high-transmittance area where pixels are removed as shown in FIGS. 4 and 7-10). In FIG. 11, cathode 52 is formed over red, blue, and green pixels 22 and is omitted within opening 82.

FIG. 11 further shows how one or more signal lines formed from metal layer 68 may extend through cathode opening 82 (e.g., similar to as shown in FIG. 10). In FIG. 11, openings 84 (sometimes be referred to as organic layer openings 84) in organic planarization layers 44 and 46 may be formed within portions of cathode opening 82 that are not overlapped by metal layer 68. In FIG. 11, there are two discrete openings 84 on either side of signal lines formed by metal layer 68.

In FIG. 11, the footprint of cathode opening 82 has a first total area. The footprints of the one or more openings 84 aligned with (e.g., at least partially overlapping) cathode opening 82 have a second total area. The second total area may be more than 40% of the first total area, more than 50% of the first total area, more than 60% of the first total area, more than 70% of the first total area, more than 80% of the first total area, more than 90% of the first total area, less than 100% of the first total area, less than 90% of the first total area, less than 75% of the first total area, less than 60% of the first total area, less than 50% of the first total area, etc.

In FIG. 11, the footprints of openings 84 do not overlap metal layers 68. The footprints of openings 84 are also entirely contained within the footprint of cathode opening 82. In other words, no portion of either opening 84 extends past a boundary of cathode opening 82. This example is merely illustrative. In another possible arrangement, shown in FIG. 12, portions of one or more openings 84 extends past a boundary of cathode opening 82. The footprints of openings 84 are overlapped by portions of cathode 52. The footprints of openings 84 in FIG. 12 are not entirely contained within the footprint of cathode opening 82.

In FIG. 12, the footprint of cathode opening 82 has a first total area. The footprints of the one or more openings 84 aligned with cathode opening 82 have a second total area. The second total area may be more than 80% of the first total area, more than 100% of the first total area, more than 120% of the first total area, more than 150% of the first total area, more than 200% of the first total area, less than 300% of the first total area, less than 200% of the first total area, less than 150% of the first total area, less than 100% of the first total area, etc.

In FIGS. 11 and 12, none of organic planarization layers 44 and 46 are removed in the region that overlaps cathode opening 82 and includes metal layer 68. This example is merely illustrative. In another possible arrangement, shown in FIG. 13, there may be a region 88 that includes metal layers 68 in which planarization layer 44 is removed (as shown in FIG. 10). Region 88 including metal layer portions and at least one organic layer opening may be included when the footprints of openings 84 extend past the cathode opening (as in FIGS. 12 and 13) or when the footprints of openings 84 are contained entirely within the cathode opening (as in FIG. 11).

In FIG. 12, more organic material is removed in pixel removal region 332 than in FIG. 11. In FIG. 13, more organic material is removed in pixel removal region 332 than in FIG. 12. Generally, removing more organic material may provide improved mitigation of outgassing and corresponding display artifacts. However, removing more organic material may require greater manufacturing complexity in some scenarios or may have other tradeoffs. Therefore, the amount of organic material removed for each cathode opening may be optimized for a given display design.

In FIGS. 11-13, the pixel definition layer may extend continuously across the cathode opening (as in FIG. 7) or may be removed (with the same footprint as openings 84 or with a different footprint than openings 84).

Each cathode opening in region 332 may have one or more corresponding openings 84 (e.g., having one of the patterns of FIGS. 11-13) and/or one or more corresponding openings 86.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   a sensor; and
   a display having a portion that overlaps the sensor, wherein the display comprises:
   a substrate;
   a first organic planarization layer formed over the substrate;
   a second organic planarization layer formed over the first organic planarization layer;
   a plurality of anodes for a plurality of display pixels in the portion that overlaps the sensor, wherein the plurality of anodes is formed over the second organic planarization layer;
   a cathode for the plurality of display pixels, wherein the cathode is formed over the plurality of anodes, wherein the cathode has a first opening between the plurality of display pixels, and wherein at least a selected one of the first organic planarization layer and the second organic planarization layer has a second opening that at least partially overlaps the first opening; and
   an organic light-emitting diode layer for the plurality of pixels that extends continuously across the first opening.

2. The electronic device defined in claim 1, wherein the display emits light in a direction and wherein the organic light-emitting diode layer overlaps the first opening in the direction.

3. The electronic device defined in claim 1, wherein the second opening comprises an opening in both the first and second organic planarization layers.

4. The electronic device defined in claim 1, wherein all portions of the second opening are overlapped by the first opening.

5. The electronic device defined in claim 1, wherein a first portion of the second opening is overlapped by the first opening and wherein a second portion of the second opening is overlapped by the cathode.

6. The electronic device defined in claim 1, further comprising:
   a first metal layer formed on the substrate and covered by the first organic planarization layer; and
   a second metal layer formed on the first organic planarization layer and covered by the second organic planarization layer.

7. The electronic device defined in claim 6, wherein the display emits light in a direction and wherein a signal line formed by a selected one of the first metal layer and the second metal layer is overlapped by the first opening in the direction.

8. The electronic device defined in claim 7, wherein the at least selected one of the first organic planarization layer and the second organic planarization layer has a third opening that at least partially overlaps the first opening, wherein the second opening is formed on a first side of the signal line, and wherein the third opening is formed on a second side of the signal line.

9. The electronic device defined in claim 7, wherein the second opening comprises an opening in both the first and second organic planarization layers and wherein only one of the first and second planarization layers is included over a portion of the signal line that is overlapped by the first opening.

10. The electronic device defined in claim 1, further comprising:
a pixel definition layer that is formed over the second organic planarization layer and beneath the cathode.

11. The electronic device defined in claim 10, wherein the pixel definition layer has a third opening that at least partially overlaps the first opening.

12. The electronic device defined in claim 10, wherein the pixel definition layer extends continuously across the first opening.

13. The electronic device defined in claim 12, wherein the pixel definition layer extends into the second opening and is in direct contact with the substrate in the second opening.

14. An electronic device, comprising:
a sensor; and
a display having a portion that overlaps the sensor, wherein the display comprises:
  a substrate;
  a first organic layer formed over the substrate;
  a second organic layer formed over the first organic layer;
  a third organic layer formed over the second organic layer;
  organic light-emitting diode layers formed over the third organic layer; and
  a common electrode for a plurality of display pixels in the portion, wherein the first, second, and third organic layers are interposed between the substrate and the common electrode, wherein the common electrode has a first opening between the plurality of display pixels, and wherein at least one of the first, second, and third organic layers has a second opening that at least partially overlaps the first opening.

15. The electronic device defined in claim 14, wherein the at least one of the first, second, and third organic layers comprises the first organic layer, the second organic layer, and the third organic layer.

16. The electronic device defined in claim 14, wherein the at least one of the first, second, and third organic layers is only the first organic layer and the second organic layer.

17. The electronic device defined in claim 14, wherein the at least one of the first, second, and third organic layers is only the third organic layer.

18. The electronic device defined in claim 14, wherein the organic light-emitting diode layers extend continuously through the first opening.

19. The electronic device defined in claim 14, wherein a first portion of the second opening is overlapped by the first opening and wherein a second portion of the second opening is overlapped by the common electrode.

20. An electronic device, comprising:
a sensor; and
a display having an array of pixels, wherein the display comprises:
  a first portion having a first pixel density;
  a second portion having a second pixel density that is lower than the first pixel density, wherein the second portion overlaps the sensor;
  a plurality of anodes for the array of pixels;
  a common cathode for the array of pixels, wherein the common cathode has a plurality of first openings in the second portion of the display;
  at least one organic layer that is formed underneath the common cathode, wherein the at least one organic layer has a plurality of second openings and wherein each one of the plurality of second openings is at least partially aligned with one of the plurality of first openings; and
  a pixel definition layer that is formed over the at least one organic layer and beneath the common cathode, wherein the pixel definition layer extends continuously across at least some of the plurality of first openings.

* * * * *